United States Patent [19]

Inada et al.

[11] Patent Number: 5,874,009

[45] Date of Patent: *Feb. 23, 1999

[54] MULTILAYER PRINTED CIRCUIT BOARD WITH EPOXY RESIN AND CARBOXYLATED RUBBER AS ADHESIVE

[75] Inventors: Teiichi Inada; Yoshiyuki Tsuru; Shin Takanezawa, all of Shimodate, Japan

[73] Assignee: Hitachi Chemical Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 514,739

[22] Filed: Aug. 14, 1995

[30] Foreign Application Priority Data

May 10, 1995 [JP] Japan ..................................... 7-111719

[51] Int. Cl.$^6$ .............................. B32B 7/12; B32B 27/04; B32B 27/38
[52] U.S. Cl. .............................. 216/20; 156/153; 156/295
[58] Field of Search .............................. 156/630.1, 632.1, 156/151, 153, 154, 295; 216/20

[56] References Cited

U.S. PATENT DOCUMENTS

| | | | |
|---|---|---|---|
| 4,511,757 | 4/1985 | Ors et al. ................................. | 428/901 |
| 4,985,751 | 1/1991 | Shiobara et al. .......................... | 357/72 |
| 5,006,433 | 4/1991 | Yoyoka et al. ............................ | 430/49 |
| 5,053,280 | 10/1991 | Takanezawa et al. .................. | 428/413 |
| 5,104,604 | 4/1992 | Gallo ....................................... | 523/460 |
| 5,160,783 | 11/1992 | Nemoto et al. .......................... | 428/413 |
| 5,571,447 | 11/1996 | Ward et al. .............................. | 510/206 |

FOREIGN PATENT DOCUMENTS

| | | |
|---|---|---|
| 0 559 437 | 9/1993 | European Pat. Off. . |
| 4-186698 | 7/1992 | Japan . |
| 4-284687 | 10/1992 | Japan . |
| 5-21961 | 1/1993 | Japan . |
| 6-1961 | 1/1994 | Japan . |
| 2 259 812 | 3/1993 | United Kingdom . |

OTHER PUBLICATIONS

WPAT accession No. 89–021205/03 for Japanese Patent No. 63–299148, Nitto Electric Ind KK, Dec. 1988.

*Primary Examiner*—Robert E. Sellers
*Attorney, Agent, or Firm*—Antonelli, Terry, Stout & Kraus, LLP

[57] ABSTRACT

A multilayered printed circuit board is produced by (a) forming a resin layer on an inner circuit substrate and abrading it to expose the circuit conductors, (b) contacting a copper foil having a layer of insulating adhesive composed of an epoxy resin, a carboxylic acid-containing acrylic or acrylonitrile-butadiene rubber, a curing agent and accelerator with the resin layer and exposed circuit conductors, (c) removing portions necessary for connection with the copper foil and insulating adhesive exposed to the holes by etching, (d) connecting the copper foil with circuits exposed to the holes and forming a surface circuit by processing the outer layer of the copper foil, and (e) repeating steps (a) to (d) to obtained a multilayered structure.

3 Claims, 2 Drawing Sheets

MULTILAYER PRINTED CIRCUIT BOARD WITH EPOXY RESIN AND CARBOXYLATED RUBBER AS ADHESIVE

BACKGROUND OF THE INVENTION

This invention relates to a resin composition and processes for producing a multilayer printed circuit board using said resin composition.

Usual multilayer printed circuit boards are produced by piling a prepreg, which is obtained by impregnating glass cloth with an epoxy resin and semi-curing the resin, together with a copper foil on an insulating substrate having interlayer circuits thereon, laminating them into an integrated structure by pressing with heating, drilling holes for interlaminer connection, conducting electroless plating on the inner walls of through-holes and copper foil surface, if necessary, conducting electrolytic plating so as to make circuit conductors in necessary thickness, removing selectively unnecessary copper, and forming circuit conductors.

With recent tendency of miniaturization, light weight and multi-functionality of electronic devices, an increase of the degree of integration of large scale integrated circuits (LSI) and miniaturization of chip parts proceed together with an increase of connecting pins and miniaturization of parts. Thus, in order to mount these parts, wiring in multilayer printed circuit boards becomes finer and finer. But the reduction of the width of wiring has naturally a limit technically. Today, the minimum wiring width for mass production is about 100 μm. Further, the size of through-holes, which occupies a considerably large area compared with the wiring width, becomes an obstacle for improving wiring density. These through-holes are drilled mechanically in general. Since it is difficult to make the diameter of a drill smaller from the viewpoint of maintaining mechanical strength, it is difficult to make the areas of through-holes smaller.

Recently, it is reported various processes for forming through-holes without using a drill. For example, there are reported, first, hole fabrication using a laser, second, a process for forming via holes selectively, and third, a process for selectively removing only an insulating material by etching.

According to the first process of using a laser, the diameter of through-holes can be lessened, but the laser per se is expensive, and it requires a step for removing molten glass, resins, etc. after hole-fabrication, and thus not efficient.

According to the second process of selective via hole formation, a multilayer printed circuit board is produced by forming holes previously in a prepreg or a thin adhesive sheet, laminating the prepreg or the like on a circuit substrate, electrically connecting inner walls of the holes to outer conductors using an electroconducting substance, conducting circuit processing, and repeating these steps for forming multilayers. But since the resin of prepreg or the adhesive of the adhesive sheet has fluidity, when holes having a small diameter are formed, the resin or the adhesive is forced to ooze into the interior of the holes at the time of lamination, resulting in making the hole diameter smaller.

According to the third process, the problem mentioned above can be solved. For example, as disclosed in Japanese Patent Examined Publication (JP-B) No. 42-24109, an insulating adhesive is attached to a metallic foil, followed by selective removal of a part of the metallic foil, wherein the removed portion can be corroded with a suitable corrosive. Thus, small holes which can not be formed by drilling can be fabricated. Further, it is not necessary to use an expensive special device such as a laser. But according to said JP-B, a thin film of polyester is used as an insulating material and concentrated sulfuric acid is used for corrosion. But, the polyester film is not used in printed circuit boards now. Thus, the use of polyester film is not practical.

The use of an alkali-soluble resin as an insulating material in place of the polyester is disclosed in Japanese Patent Unexamined Publication (JP-A) No. 5-259649. According to said JP-A, a multilayer printed circuit board is produced by forming an insulating layer on an inner layer circuit substrate using an uncured alkali-soluble resin, laminating a copper foil thereon, forming an etching resist except for positions of holes to be formed, removing the exposed copper foil not covered with the resist by etching using a chemical etching solution, further removing the exposed alkali-soluble resin by etching using an alkaline solution to form via holes, curing the alkali-soluble resin, and metallizing the inner portion by electroless plating or the like for electrical connection. But according to the process of said JP-A, there are the following problems:

(i) Since the alkali-soluble resin is used, it is not possible to use an alkaline solution in other steps.

(ii) When the alkali-soluble resin is cured, the resin is fluidized to make the hole diameter smaller.

SUMMARY OF THE INVENTION

It is an object of the present invention to provide a resin composition which is excellently subjected to chemical etching and effectively used as an insulating adhesive in the production of multilayer printed circuit boards economically and without damaging working circumstances. It is another object of the present invention to provide a process for chemically etching a resin layer made from the above-mentioned resin composition using a special chemical etching solution. It is a further object of the present invention to provide processes for producing multilayer printed circuit boards using the above-mentioned resin composition as an insulating adhesive.

The present invention provides a resin composition comprising
(a) an epoxy resin having a number average molecular weight of 1200 or less in an amount of 30 to 100 parts by weight,
(b) a carboxylic acid-containing acrylic rubber or a carboxylic acid-containing acrylonitrile-butadiene rubber in an amount of 30 to 70 parts by weight,
(c) a curing agent for the epoxy resin, and
(d) a curing accelerator.

The present invention also provides a process for chemical etching a resin layer of the above-mentioned resin composition in A-stage or B-stage, which comprises contacting the resin layer with a chemical etching solution comprising water and an organic solvent having a vapor pressure of 133 Pa or less at 25° C. to conduct chemical erosion.

The present invention further provides a process for producing a multilayer printed circuit board, which comprises the steps of:
(a) forming a resin layer for filling hollow portions between circuit conductors on the whole surface of an inner circuit substrate, followed by abrasion of the resin layer so as to expose the circuit conductors,
(b) piling a copper foil having a layer of insulating adhesive on one side so as to contact the insulating adhesive with the resin layer and the exposed circuit conductors, followed by lamination to form an integrated structure with heating under pressure, (c) removing portions necessary for connection with the copper foil by etching, and removing the insulating adhesive exposed to holes by chemical etching, (d) connecting the copper foil with circuits exposed to the holes and forming a surface circuit by processing an outer layer of the copper foil, and (e) repeating the steps (a) to (d) depending on the number of circuit layers necessitated.

The present invention still further provides a process for producing a multilayer printed circuit board, which comprises the steps of:

(a) printing or coating a filling material for hollow portions and having fluidity at B-stage on hollow portions of a circuit substrate, (b) drying the filling material, followed by curing to B-stage, (c) piling a copper foil having a layer of insulating adhesive made from the above-mentioned resin composition which is capable of forming via holes by chemical etching on one side so as to contact the insulating adhesive with the filling material coated surface, followed by lamination to form an integrated structure, (d) removing portions necessary for connection with the copper foil by etching, and removing the insulating adhesive exposed to holes by chemical etching, (e) connecting the copper foil with circuits exposed to the holes and forming a surface circuit by processing an outer layer of the copper foil, and (f) repeating the steps (a) to (e) depending on the number of circuit layers necessitated.

The present invention also provides a process for producing a multilayer printed circuit board, which comprises the steps of:

(a) forming via holes in a copper foil having a layer of insulating adhesive made from the above-mentioned resin composition which is capable of forming holes by chemical etching, (b) piling the copper foil having a layer of insulating adhesive with via holes on one side of an inner circuit board so as to contact the insulating adhesive with circuit conductors on the inner layer circuit board, followed by lamination to form an integrated structure with heating under pressure, (c) removing the insulating adhesive oozed into the holes by chemical etching, (d) curing with heating the insulating adhesive to form via holes or a cavity, (e) forming conductive pathes in via holes or a cavity using an electroconductive paint or metallic deposition by plating, and (f) repeating the steps (a) to (e) depending on the number of circuit layers necessitated.

The present invention further provides a process for producing a multilayer printed circuit board, which comprises the steps of:

(a) forming via holes in a sheet of insulating adhesive made from the above-mentioned resin composition which is capable of forming holes by chemical etching, (b) piling the sheet with holes on one side of an inner circuit board so as to contact the insulating adhesive with circuit conductors on the inner layer circuit board, and piling a copper foil on the insulating adhesive with holes, followed by lamination to form an integrated structure with heating under pressure, (c) removing copper from portions in which via holes are to be made in the insulating adhesive, and removing the insulating adhesive oozed into the holes by chemical etching, (d) curing with heating the insulating adhesive to form via holes or a cavity, (e) forming conductive pathes in via holes or a cavity using an electroconductive paint or metallic deposition by plating, and (f) repeating the steps (a) to (e) depending on the number of circuit layers necessitated.

DESCRIPTION OF THE PREFERRED EMBODIMENTS

Figure 1A:
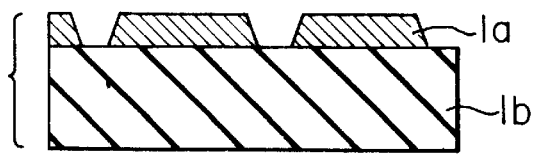
FIGS. 1A to 1F are cross-sectional views for explaining a process for producing a multilayer printed circuit board according to one example of the present invention, wherein a filling material is used.
Figure 1D:
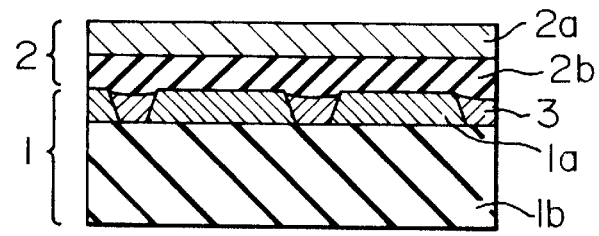
Figure 1B:
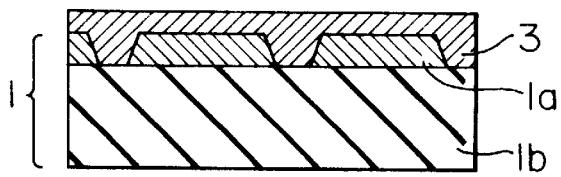
Figure 1E:
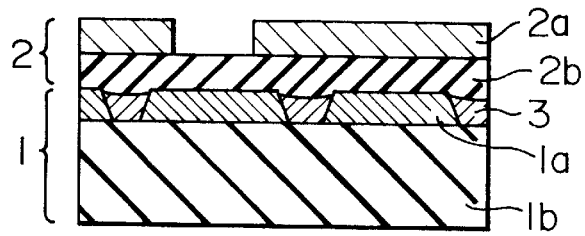
Figure 1C:
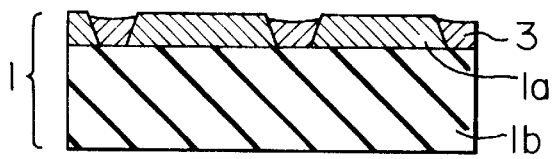
Figure 1F:
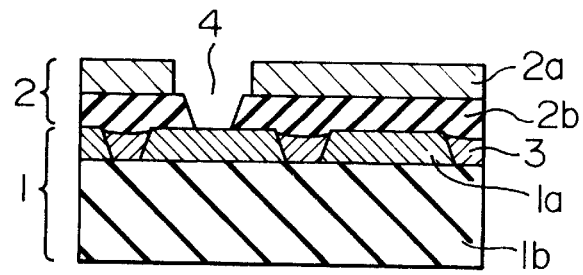

The resin composition of the present invention comprises (a) an epoxy resin having a number average molecular weight of 1200 or less in an amount of 30 to 100 parts by weight, (b) a carboxylic acid-containing acrylic rubber or a carboxylic acid-containing acrylonitrile-butadiene rubber in an amount of 30 to 70 parts by weight, (c) a curing agent for the epoxy resin, and (d) a curing accelerator.

As the epoxy resin having a number average molecular weight (Mn) of 1200 or less, there can be used bisphenol A type epoxy resins, bisphenol F type epoxy resins, cresol novolac type epoxy resins, phenol novolac type epoxy resins, alicyclic epoxy resins, glycidyl ester type epoxy resins, etc. Further, it is also possible to use these epoxy resins added with halogens such as bromine, etc.

The number average molecular weight (Mn) can be measured by gel permeation chromatography (G.P.C.).

The use of bisphenol A type epoxy resins and bisphenol F type epoxy resins, each having the number average molecular weight (Mn) of 500 or less is particularly preferable due to giving fluidity suitable for filling vacant spaces among inner layer circuits at the time of lamination. Such epoxy resins are commercially available under trade names, for example, Epikote 807, 827, and 828 (each mfd. by Yuka Shell Co., Ltd.), DER 330, 331, and 361 (each mfd. by Dow Chemical Japan Co., Ltd.), YD 128, and YDF 170 (each mfd. by Tohto Kasei Co., Ltd.).

The epoxy resin having a number average molecular weight of 1200 less is used in an amount of 30 to 100 parts by weight. When the amount is less than 30 parts by weight, the adhesiveness to a copper foil is lowered, while when the amount is more than 100 parts by weight, the workability at an uncured stage is lowered.

As the component (b), there can be used a carboxylic acid-containing acrylic rubber or a carboxylic acid-containing acrylonitrile-butadiene rubber. As the carboxylic acid, there can be used acrylic acid, methacrylic acid, maleic acid, etc.

The carboxylic acid-containing acrylonitrile-butadiene rubber can be obtained, for example, by copolymerizing butadiene, acrylic acid and acrylonitrile, or copolymerizing butadiene, methacrylic acid and acrylonitrile. It is also possible to use that obtained by adding a carboxylic acid such as maleic acid, acrylic acid, or the like to double bond sites of acrylonitrile-butadiene rubber.

The amount of the carboxylic acid is preferably in the range of 2 to 12% by mole in the carbon skeleton of main chain of acrylic rubber or acrylonitrile-butadiene rubber. When the amount is less than 2% by mole, there is a tendency to lower chemical etching ability of the resin composition. On the other hand, when the amount is more than 12% by mole, there is a tendency to lower resistance to a plating solution.

The amount of acrylonitrile is not particularly limited, but the amount of 20% by weight or more is preferable from the viewpoint of compatibility with other resins.

Examples of the acrylic acid-containing acrylonitrile-butadiene rubber or methacrylic acid-containing acrylonitrile-butadiene rubber are acrylonitrile-butadiene rubbers having functional groups such as carboxyl groups, which are available under trade names of PNR-1H (mfd. by Japan Synthetic Rubber Co., Ltd.), Nipol 1072 (mfd. by the Japanese Geon Co., Ltd.).

The carboxylic acid-containing acrylic rubber or the carboxylic acid-containing acrylonitrile-butadiene rubber is used in an amount of 30 to 70 parts by weight. When the amount is less than 30 parts by weight, the workability at an uncured state is lowered, while when the amount is more than 70 parts by weight, the adhesive strength to a copper foil at high temperatures is lowered.

As the curing agent (c) for the epoxy resin, these can be used novolac type phenol resins and novolac type cresol resins, which can give good chemical etching properties (i.e. the resin composition can easily be chemically etched) and good resistance to electrolytic corrosion in high humidity. Such curing agents for the epoxy resins are available commercially under trade names such as Phenolite LF 2882, Phenolite LF 2822, Phenolite TD-2149, Phenolite VH 4150, and Phenolite 4170, (each mfd. by Dainippon Ink and Chemicals, Inc.).

The curing agent is used in an amount of preferably 30 to 100 parts by weight per 100 parts by weight of the epoxy resin (a). It is preferable to use the curing agent so as to make the epoxy groups of the epoxy resin and the OH groups of the curing agent (i.e. phenol resin or cresol resin) almost equal amounts. When the amount is less than 30 parts by weight, there is a tendency to lower resistance to heat due to lowering in crosslinking density. On the other hand, when the amount is more than 100 parts by weight, there is a tendency to lower insulating properties in high humidity.

As the curing accelerator (d), there can be used aliphatic amines, aromatic amines, aliphatic acid anhydrides, aromatic acid anhydrides, alicyclic acid anhydrides, polyamides, imidazoles, amine complexes, amine derivatives, and phenols.

Concrete examples of the imidazoles are 2-methylimidazole, 2-ethyl-4-methylimidazole, 1-cyanoethyl-2-phenylimidazole, 1-cyanoethyl-2-phenylimidazolium trimellitate, etc. Commercially available imidazoles are 2E4MZ, 2PZ-CN, 2PZ-CNS (mfd. by Shikoku Chemicals Corp.).

The curing accelerator can be used in an amount of preferably 0.1 to 10 parts by weight per 100 parts by weight of the epoxy resin (a). When the amount is less than 0.1 part by weight, there is a tendency to make curing insufficient, while when the amount is more than 10 parts by weight, there is a tendency to make the life of resin composition shorter.

The resin composition may further contain one or more ion adsorbents for adsorbing ionic impurities so as to enhance insulation reliability, particularly that in high humidity. As the ion adsorbents, there can be used inorganic ion exchange materials such as aluminosilicate condensation type zeolite, silica gel, activated clay such as montmorillonite, antimony-bismuth compounds, e.g. IXE-600 (a trade name, mfd. by Toagosei Chemical Industry Co., Ltd.), magnesium-aluminum compounds, e.g. IXE-700 (a trade name, mfd. by Toagosei Chemical Industry Co., Ltd.), zirconium compounds, e.g. IXE-100 (a trade name, mfd. by Toagosei Chemical Industry Co., Ltd.), hydrotalcite, e.g. DHT-4A (a trade name, mfd. by Kyowa Chemical Industry Co., Ltd.).

The ion adsorbent can be used in an amount of preferably 0.5 to 20 parts by weight per 100 parts by weight of the epoxy resin (a). When the amount is less than 0.5 part by weight, there is a tendency to lower adsorption effect, while when the amount is more than 20 parts by weight, more effect corresponding to the amount used cannot be expected, and thus ineconomical.

The resin composition may further contain one or more inorganic fillers. In order to enhance heat dissipation properties, it is preferable to use alumina powder, aluminum nitride powder, boron nitride powder, crystalline silica, amorphous silica, etc. In order to control melt viscosity and to provide thixotropic properties, it is preferable to use aluminum hydroxide, magnesium hydroxide, calcium silicate, magnesium silicate, calcium oxide, magnesium oxide, alumina, crystalline silica, amorphous silica, zirconium silicate, talc, barium sulfate, etc. In order to provide fire retardance, it is preferable to use aluminum hydroxide, magnesium hydroxide, etc.

The amount of the inorganic filler is preferably 30 to 200 parts by weight per 100 parts by weight of the resin composition containing the components (a), (b), (c) and (d) plus ion adsorbent. When the amount is less than 30 parts by weight, there is a tendency to fail to obtain necessary heat dissipation properties, melt viscosity, thixotropic properties, and fire retardance of the resin composition. On the other hand, when the amount is more than 200 parts by weight, there is a tendency to lower flexibility of the resin composition, to lower adhesiveness of the resin composition, or to lower dielectric strength of the resin composition due to remaining voids.

The resin composition may further contain one or more silane coupling agents. Examples of the silane coupling agents are γ-glycidoxypropyltrimethylsilane (NCU A-187, a trade name, mfd. by Nippon Unicar Co., Ltd.), γ-mercaptopropyltrimethoxysilane (NCU A-189, a trade name, mfd. by Nippon Unicar Co., Ltd.), γ-aminopropyltriethoxysilane (NCU A-1100, a trade name, mfd. by Nippon Unicar Co., Ltd.), γ-ureidopropyltriethoxysilane (NCU A-1160, a trade name, mfd. by Nippon Unicar Co., Ltd.), N-β-aminoethyl-γ-aminopropyltrimethoxysilane (NCU A-1120, a trade name, mfd. by Nippon Unicar Co., Ltd.), etc.

The silane coupling agent is preferably used in an amount sufficient for covering interfaces of the inorganic filler. Usually, 0.5 to 10 parts by weight of the silane coupling agent is used per 100 parts by weight of the resin composition including the components (a), (b), (c) and (d) plus the ion adsorbent and the inorganic filler. When the amount is less than 0.5 parts by weight, there is a tendency to make the adhesive properties at interfaces of the filler and the resin insufficient and to lower adhesiveness in high humidity. On the other hand, when the amount is more than 10 parts by weight, resistance to heat is undesirably lowered and economic merit is lowered.

The resin composition and the additives mentioned above can be mixed using a mixing and grinding machine, a three roll mill, an end mill, etc. Particularly when one or more inorganic fillers are to be mixed, it is necessary to conduct sufficient mixing. It is preferable to conduct vacuum deaeration of the resin composition after mixing so as to remove bubbles. Further, in order to shorten the mixing time, it is preferable to mix inorganic fillers with low molecular-weight components such as the components (c) and (d), and silane coupling agents, etc., previously, followed by mixing with high molecular-weight components such as the components (a) and (b).

When the resin composition is used in the form of the varnish, there can be used at least one organic solvent selected from ketones, esters, alcohols, Cellosolves, and the like conventionally used. When organic solvents having relatively low boiling points are used, drying at low temperatures becomes possible to desirably lower the remaining amount of solvent in the resin. Examples of the organic solvent having a relatively low boiling point are methyl ethyl ketone, acetone, methyl isobutyl ketone, ethyl Cellosolve, toluene, butyl Cellosolve, methanol, ethanol, methyl Cellosolve, etc.

Chemical etching of a resin layer of the above-mentioned resin composition can be carried out by contacting the resin layer in A-stage or B-stage with a chemical etching solution comprising water and an organic solvent having a vapor pressure of 133 Pa or less at 25° C. to conduct chemical erosion of the resin layer.

As mentioned above, the chemical etching is conducted at A-stage or B-stage of the resin, not conducted at C-stage.

A-stage, B-stage and C-stage mean various cured states of thermosetting resins depending on the reaction thereof. A-stage is a state of almost uncured and not gelled, and shows the state after heat release of 0 to 20% of the total curing exotherm. B-stage is a state of slightly cured and slightly advanced in gelation, and shows the state after heat release of 20 to 60% of the total curing exotherm. C-stage is a state of advanced in curing and gelation, and shows the state after heat release of 60 to 100% of the total curing exotherm.

The chemical etching solution comprises water and an organic solvent having a vapor pressure of 133 Pa or less at 25° C.

As the organic solvent having a vapor pressure of 133 Pa or less at 25° C., there can be used triethylene glycol, diethylene glycol monoethyl ether, diethylene glycol monobutyl ether, diethylene glycol, 2-butoxy ethanol, 2-methoxy ethanol, triethylene glycol monomethyl ether, tetraethylene glycol, polyethylene glycol, dipropylene glycol, dipropylene glycol monoethyl ether, dipropylene cresol monomethyl ether, polypropylene glycol, ethylene carbonate, propylene carbonate, etc. These solvents can be used singly or as a mixture thereof.

The organic solvent can be mixed with water in an amount of preferably 40% by volume or less, more preferably 10 to 30% by volume, based on the volume of water. When the amount is less than 10% by volume, there is a tendency to lower chemical etching ability. On the other hand, when the amount is more than 30% by volume, there is a tendency to increase a danger during working due to an increase of vaporized organic solvent.

The chemical etching solution may contain one or more alkaline components in order to increase chemical etching ability.

As the alkaline component, there can be used at least one member selected from the group consisting of borax and alkanolamines. Examples of the alkanolamines are 2-aminoethanol, 1-(dimethylamino)ethanol, 2-(diethylamino)ethanol, diethanolamine, N-butyldiethanolamine, triethanolamine, triisopropanolamine, etc.

Borax can be added in an amount of preferably 1 to 20 g, more preferably 5 to 15 g, per liter of the mixture of water and organic solvent. When the amount is less than 1 g/liter, there is a tendency to exhibit almost no additional chemical etching ability. On the other hand, when the amount is more than 20 g/liter, it is not preferable from the economical point of view.

The alkanolamine can be added in an amount of preferably 1 to 10 g per liter of the mixture of water and organic solvent. When the amount is less than 1 g/liter, there is a tendency to exhibit almost no additional chemical etching ability. On the other hand, when the amount is more than 10 g/liter, it is not preferable from the economical point of view.

Using the resin composition mentioned above and applying the chemical etching process mentioned above, multilayer printed circuit boards can be produced by various processes.

First, a multilayer printed circuit board can be produced by a process (A), which comprises the steps of:

(a) forming a resin layer for filling hollow portions between circuit conductors on the whole surface of an inner circuit substrate, followed by abrasion of the resin layer so as to expose the circuit conductors, (b) piling a copper foil having a layer of insulating adhesive on one side so as to contact the insulating adhesive with the resin layer and the exposed circuit conductors, followed by lamination to form an integrated structure with heating under pressure, (c) removing portions necessary for connection with the copper foil by etching, and removing the insulating adhesive exposed to holes by chemical etching, (d) connecting the copper foil with circuits exposed to the holes and forming a surface circuit by processing an outer layer of the copper foil, and (e) repeating the steps (a) to (d) depending on the number of circuit layers necessitated.

In the production of multilayer printed circuit boards by laminating at least one insulating adhesive material and at least one circuit layer on a circuit substrate, when hollow portions between circuits on a plane surface are filled with a filling material, it is possible to solve problems of prior art, e.g. insufficiency in moldability and circuit filling properties due to insufficiency in fluidity of resin.

The above-mentioned process is explained referring to FIGS. 1A to 1F. On a circuit substrate (or an inner circuit substrate) (1) comprising a copper foil or circuit (1a) and an insulating layer (1b) [FIG. 1A], a filling material 3 is placed so as to fill hollow portions between circuit conductors [FIG. 1B], followed by abrasion of the resin layer (of the filling material) so as to expose the circuit conductors [FIG. 1C]. Then, a copper foil (2a) having a layer of insulating adhesive (2b) on one side of the copper foil is piled on the inner circuit substrate (1) so as to contact the insulating adhesive with the resin layer and the exposed circuit conductors, followed by lamination to form an integrated structure with heating under pressure [FIG. 1D]. Then, portions necessary for electrical connection are removed from the copper foil (2a) by etching [FIG. 1E], and the insulating adhesive exposed to holes is removed by chemical etching [FIG. 1F]. Then, connection of the copper foil with circuits exposed to the holes (4) is conducted, and formation of a surface circuit by processing an outer layer of the copper foil is conducted, followed by repeating of the above-mentioned steps depending on the number of circuit layers necessitated.

As the circuit substrate (1), there can be used a copper-clad laminate using glass cloth and an epoxy resin, a copper-clad laminate using paper and a phenol resin, a metal based substrate, a metal core substrate, etc. conventionally used in this art.

As the filling material for filling hollow portions between circuits, there can be used epoxy resins, phenol resins so long as they have good insulating reliability. These resins may contain one or more inorganic fillers such as silica, alumina, etc. It is also possible to use as the filling material commercially available thermosetting solder resists, e.g. CCR-506 GTH (a trade name, mfd. by Asahi Chemical Research Laboratory Co., Ltd.), ultraviolet light curable type solder resists, e.g. PSR-4000 (a trade name, mfd. by Asahi Chemical Research Laboratory Co., Ltd.), etc.

As the insulating adhesive, there can be used conventionally used glass-epoxy prepreg, and flexibility imparting materials such as phenoxy or the like high molecular weight epoxy resins, rubbers such as acrylic rubbers, acrylonitrile rubbers, etc. But, by using the above-mentioned resin composition as the insulating adhesive, more preferable effects can be obtained. The above-mention resin composition can be used by coating on a copper foil, or in the form of a film which is then laminated on a copper foil to form an integrated structure.

The filling material and the insulating adhesive can contain one or more inorganic fillers having high dissipation properties mentioned above so as to improve heat dissipation properties of multilayer printed circuit boards. Further, combination with a circuit substrate having high heat dissipation is preferable to improve heat dissipation properties.

In the step (a) of the above-mentioned process (A), the filling material can be printed or coated on the circuit substrate. For example, there can be used a screen printing method, a curtain coating method, a coating method using a squeegee. After printing or coating the filling material on the whole surface or necessary areas of the circuit substrate, drying and curing are carried out. It is necessary to use a sufficient amount of the filling material for filling hollow portions between circuits.

In the step (b) of the above-mentioned process (A), it is also possible to use a copper foil attaching an insulating adhesive thereto and having holes therein previously. In such a case, the filling material is previously printed or coated on hollow portions between circuits on a circuit substrate, followed by removal of superfluous filling material on the circuits by abrasion.

Interlaminer connection after lamination can be carried out using an electroconductive paste, plating, wire bonding, and the like.

The chemical etching of the insulating adhesive in the step (c) can be carried out using a sulfonic acid as an etching solution. But the use of the chemical etching solution mentioned above is preferable.

The lamination to form an integrated structure can be carried out by using a press, a vacuum press, a hot roll laminator, a vacuum laminator, and the like.

The circuit formation can be carried out by forming an etching resist and removing unnecessary copper by etching to form a conductor circuit on necessary portions of the substrate.

According to the process (A), since the multilayer printed circuit board is formed after flattening the circuit surface of the circuit substrate using the filling material, followed by lamination of insulating adhesive layer, the moldability can be improved, the surface flatness can be obtained and the thinning of the board can be attained. In addition, the reliability of interlaminer connection can also be improved. When an inorganic filler having high heat conductivity is used in the filling material and/or the insulating adhesive, the heat dissipation properties of the multilayer printed circuit board can be improved.

The surface flatness of circuits can also be improved by printing or coating a filling material for filling hollow portions between circuits on the circuit substrate and having fluidity at A-stage or B-stage. By this process (B), both the improvement in filling of circuit interstices and the reduction in flowing amount of the insulating adhesive from holes for interlaminer connection can be attained, resulting in giving multilayer printed circuit boards improved in flatness of circuit surface and excellent in reliability of interlaminer connection.

The process (B) for producing a multilayer printed circuit board comprises the steps of:

(a) printing or coating a filling material for hollow portions and having fluidity at B-stage on hollow portions of a circuit substrate, (b) drying the filling material, followed by curing to B-state, (c) piling a copper foil having a layer of insulating adhesive which is capable of forming via holes by chemical etching on one side so as to contact the insulating adhesive with the filling material coated surface, followed by lamination to form an integrated structure, (d) removing portions necessary for connection with the copper foil by etching, and removing the insulating adhesive exposed to holes by chemical etching, (e) connecting the copper foil with circuits exposed to the holes and forming a surface circuit by processing an outer layer of the copper foil, and (f) repeating the steps (a) to (e) depending on the number of circuit layers necessitated,
said insulating adhesive being the resin composition mentioned above comprising (a) an epoxy resin having a number average molecular weight of 1200 or less in an amount of 30 to 100 parts by weight, (b) a carboxylic acid-containing acrylic rubber or a carboxylic acid-containing acrylonitrile-butadiene rubber in an amount of 30 to 70 parts by weight, (c) a curing agent for the epoxy resin, and (d) a curing accelerator.

In the process (B), as the circuit substrate, that mentioned in the process (A) can also be used.

As the filling material, it is necessary to have fluidity at A-stage or B-stage. Examples of such a filling material are epoxy resins and phenol resins. The filling material may contain one or more inorganic fillers such as silica, alumina, etc. mentioned above. It is also possible to use commercially available thermosetting solder resists, e.g. CCR-506GTH (a trade name, mfd. by Asahi Chemical Research Laboratory Co., Ltd.), ultraviolet light curable solder resists, e.g. PSR-4000 (a trade name, mfd. by Asahi Chemical Research Laboratory Co., Ltd.), etc.

The filling material may contain one or more inorganic fillers to control the fluidity of the filling material, to improve mechanical strength, to control thermal expansion coefficient, to improve heat dissipation properties, or to reduce the production cost. Examples of such inorganic fillers are those mentioned above, e.g. silica, alumina, aluminum hydroxide, talc, boron nitride, aluminum nitride, etc.

As the insulating adhesive, it is preferable to use the resin composition mentioned above.

The printing or coating of the filling material can be carried out as described in the process (A). After filling hollow portions of the circuit substrate, the filling material is dried. It is necessary to use the filling material in an amount necessary for sufficiently filling the hollow portions.

As to the printing pattern, the space of about 0.05 to 0.2 mm is preferable so as to avoid the overlap of the circuits and the hollow portion filling material. The space is preferably controlled by printing precision. When the space between circuits is less than 0.4 mm, it is difficult to carry out the printing therein. In such a case, when there is no interlaminer connection on the circuits, the printing is carried out on the whole surface. The filling material on the circuits can flow by the pressure at the time of lamination, so that there can be obtained good surface flatness of the substrate.

The circuit substrate, on which the hollow portion filling material is printed or coated previously, is subjected lamination of a layer of an insulating adhesive. At this time, since the hollow portion filling material has fluidity, it flows at the time of lamination. As a result, it is possible to fill interstices between the circuits and the filling material without generating bubbles. After lamination, interlaminer connection can be carried out using an electroconductive paste, plating, wire bonding, etc.

The lamination of a layer of insulating adhesive can be carried out in the same manner as described in the process (A).

In the process (B), since the layer of insulating adhesive is laminated on the circuit substrate after flattening hollow portions between circuits with the resin of filling material, it is possible to improve moldability of the multilayer printed circuit board, and to obtain surface flatness and thinning of the multilayer printed circuit board. By employing above-mentioned steps, the interlaminer connection reliability is also improved. Further, by adding an inorganic filler having high heat conductivity to the filling material and/or the insulating adhesive, the heat dissipation properties of the printed circuit board can be improved.

The present invention further provides a process (C) for producing a multilayer printed circuit board, which comprises the steps of:
(a) forming via holes in a copper foil having a layer of insulating adhesive which is capable of forming holes by chemical etching,
(b) piling the copper foil having a layer of insulating adhesive with via holes on one side of an inner circuit board so as to contact the insulating adhesive with circuit conductors on the inner layer circuit board, followed by lamination to form an integrated structure with heating under pressure,
(c) removing the insulating adhesive oozed into the holes by chemical etching,
(d) curing with heating the insulating adhesive to form via holes or a cavity,
(e) forming conductive pathes in via holes or a cavity using an electroconductive paint or metallic deposition by plating, and
(f) repeating the steps (a) to (e) depending on the number of circuit layers necessitated,
said insulating adhesive comprising
(a) an epoxy resin having a number average molecular weight of 1200 or less in an amount of 30 to 100 parts by weight,
(b) a carboxylic acid-containing acrylic rubber or a carboxylic acid-containing acrylonitrile-butadiene rubber in an amount of 30 to 70 parts by weight,
(c) a curing agent for the epoxy resin, and
(d) a curing accelerator.

The insulating adhesive used in the process (C) is the same as the resin composition mentioned above and preferably has flexibility at B-stage and easily be chemically etched. The flexibility at the B-stage is necessary for drilling, punching and cutting using an end mill in order to prevent defects such as generation of cracks in the insulating adhesive layer.

As the solution for chemical etching, the chemical etching solution mentioned above can be used.

In order to form via holes, it is necessary to use a sheet of insulating adhesive or a sheet of copper foil or conductor foil attaching a sheet-like e insulating adhesive thereto, or a sheet of a copper foil or conductor foil obtained by coating an insulating adhesive thereon.

The sheet of insulating adhesive can be obtained by coating a solution of insulating adhesive on a film previously treated with a mold release agent, followed by drying and semi-curing. The sheet of copper foil attaching the sheet-like insulating adhesive can be prepared by pressing or rolling the insulating adhesive material at a temperature not proceeding curing of the insulating adhesive but softening the insulating adhesive. The sheet of the copper foil coated with the insulating adhesive can be prepared by coating the insulating adhesive solution on a copper foil as mentioned above.

When holes are formed in the sheet-like insulating adhesive and lamination is followed, the resin flows by the heat and pressure applied at the time of lamination, resulting in causing ooze of the resin into the holes. The oozed flowable resin component is then removed by chemical etching (see step (c)), so that the contact area at the bottom portions of the holes can be maintained, and oozing of the resin into processed circuits in a cavity can be prevented and coating of the processed circuits in a cavity with the resin can be prevented.

Further, the insulating adhesive material can be composed of a component which shows fluidity against the heat and pressure at the time of lamination, and a component which does not show fluidity. The same effect as mentioned above can be obtained by imparting the property of easily chemically etched to at least the fluidity showing component. In this case, the degree of oozing of the flowable component into the holes becomes smaller compared with the case of using only the flowable component, resulting in shortening the time necessary for chemical etching. Further, it is advantageous to use the non-flowable component which is excellent in insulation reliability.

As the component showing fluidity, there can be used flowable components capable of being chemically etched mentioned above.

As the non-flowable component, there can be used high molecular weight epoxy resins and ultra-high molecular weight epoxy resins disclosed in JP-A 4-120122, JP-A 4-120123, JP-A 4-120124, JP-A 4-120125, JP-A 4-122713, and JP-A 4-122714.

Further, the resin may contain as a non-flowable component one or more inorganic fillers such as alumina, boron nitride, aluminum nitride, silica, talc, aluminum hydroxide, etc.

The insulating adhesive material can be used as a multilayer structure, each layer having each function. In the case of two-layer structure, it is preferable that one layer is made from a material having flexibility but having almost no fluidity, while another layer is made from a material having fluidity and being easily chemically etched. By using such a structure, the oozing amount of the resin into the holes can be reduced compared with the case of one-layer structure, resulting in preferably shortening the time necessary for chemical etching.

As the component for the non-flowable layer, there can be used high molecular weight epoxy resins and ultra-high molecular weight epoxy resins as disclosed in JP-A 4-120122, JP-A-4-120123, JP-A 4-120124, JP-A 4-120125, JP-A 4-122713 and JP-A 4-122714.

It is possible to add one or more inorganic fillers such as alumina, boron nitride, aluminum nitride, silica, talc, aluminum hydroxide, etc.

Further, as this layer, there can be used a glass based epoxy resin laminate, a paper based epoxy resin laminate, a paper based phenol resin laminate, a flexible laminate, etc.

After chemical etching, the insulating adhesive is cured with heating (see step (d)).

Figure 2:
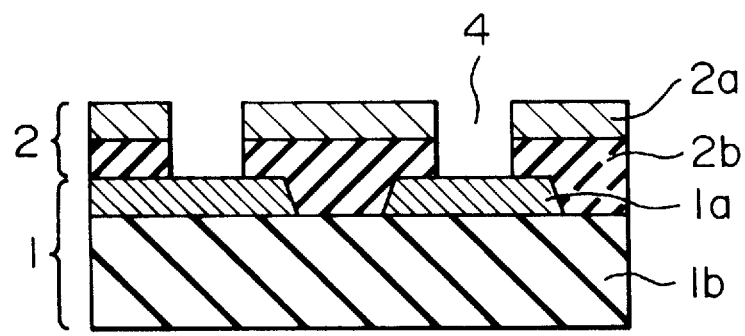
FIG. 2 is a cross-sectional view of an integrated structure by laminating a copper foil on a circuit substrate via an insulating adhesive layer.
Figure 3:
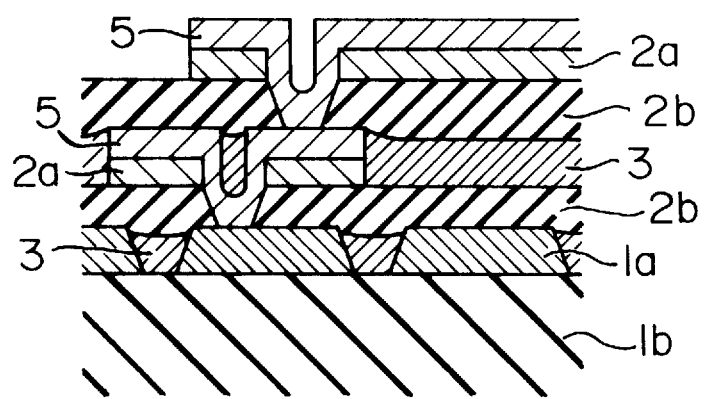
FIG. 3 is a cross-sectional view of a multilayer printed circuit board.

FIG. 2 is a cross-sectional view of a laminate (1 and 2) after forming via holes (4) for interlaminer connection.

After this, a cavity is formed as it is, or if necessary, electrical conductivity of through-holes is carried out by a conventional connecting method such as use of an electroconductive paint, plaiting or metal deposition by a tin film method, and at the same time interlaminer connection is also carried out so as to provide a multilayer printed circuit board.

By the process (C), it is possible to provide both properties of flexibility at B-stage and easy chemical etching to the insulating adhesive in addition to lamination moldability and thermosetting properties. Thus, the contact area at the bottom of holes can be maintained, and oozing of the resin into the cavity and covering of processed circuits in the cavity with the resin can be prevented.

Thus, problems of prior art in the production of multilayer printed circuit board having a cavity, e.g. failing to form terminals for wire bonding in a cavity, incapability of applying to complicated shapes such as step-like cavity structure, poor finishing of cut surface, and consistency of moldability for adhesion of multilayers and prevention of oozing of the resin, can be solved sufficiently.

The present invention still further provides a process (D) for producing a multilayer printed circuit board, which comprises the steps of;
(a) forming via holes in a sheet of insulating adhesive which is capable of forming holes by chemical etching,
(b) piling the sheet with holes on one side of an inner circuit board so as to contact the insulating adhesive with circuit conductors on the inner layer circuit board, and piling a copper foil on the insulating adhesive with holes, followed by lamination to form an integrated structure with heating under pressure,
(c) removing copper from portions in which via holes made in the insulation adhesive, and removing the insulating adhesive oozed into the holes by chemical etching,
(d) curing with heating the insulating adhesive to form via holes or a cavity,
(e) forming conductive pathes in via holes or a cavity using an electroconductive paint or metallic deposition by plating, and
(f) repeating the steps (a) to (e) depending on the number of circuit layers necessitated,
said insulating adhesive comprising
(a) an epoxy resin having a number average molecular weight of 1200 or less in an amount of 30 to 100 parts by weight,
(b) a carboxylic acid-containing acrylic rubber or a carboxylic acid-containing acrylonitrile-butadiene rubber in an amount of 30 to 70 parts by weight,
(c) a curing agent for the epoxy resin, and
(d) a curing accelerator.

In the process (D), as the insulating adhesive, the resin composition mentioned above is used.

As the chemical etching solution, that mentioned above is used.

The sheet-like insulating adhesive can be produced in the same manner as mentioned in the process (C).

The so-called interlaminer connection is carried out in the process (D) as follows. After laminating a sheet-like insulating adhesive and a copper foil, or a copper foil attaching an insulating adhesive thereto, on a circuit substrate to form an integrated structure with heating under pressure, and copper foil in which via holes are to be formed is removed by etching, followed by chemical etching of the insulating adhesive layer using a semi-aqueous etching solution to form via holes. The chemical etching includes removal of the resin by swelling and dissolution, which can be carried out by jet stream, vibration, ultrasonic wave, addition of an abrasive to an etching solution, or in combination with heating, pH adjustment, etc. The interlaminer connection can be carried out using an electroconductive paste, plating, wire bonding, etc.

As the lamination method, there can be used a press, a hot roll laminator, a vacuum laminator, etc. The use of the vacuum laminator and hot roll laminator is preferable from the viewpoint of continuous production, simplification of production steps and reduction of production cost.

As the circuit substrate, there can be used those used in the processes (A), (B) and (C) can be used.

According to the process (D), alkali resistance can be improved and interlaminer connection including an electroless plating step becomes possible.

The present invention is illustrated by way of the following Examples, in which all parts and percents are by weight unless otherwise specified.

EXAMPLE 1

Step 1

An inner circuit substrate (circuit substrate) was prepared by using a double-sided copper-clad glass cloth based epoxy resin laminate with 35 μm thick copper foil on both sides (MCL-E-67, a trade name, mfd. by Hitachi Chemical Co., Ltd.), and removing unnecessary copper foil by selective etching.

Step 2

On a copper foil, the following resin composition was coated so as to make the thickness after drying 80 μm, followed by drying at 90° C. for 10 minutes to give a copper foil attaching an insulating adhesive.

|  | parts |
| --- | --- |
| Epoxy resin (Epikote 828, a trade name, mfd. by Yuka Shell Co., Ltd., Mn = 400) | 60 |
| Acrylonitrile-butadiene rubber containing 4% by mole of methacrylic acid (PNR-1H, a trade name, mfd. by Japan Synthetic Rubber Co., Ltd.) | 40 |
| Novolac phenol resin (Phenolite 2882, a trade name, mfd. by Dainippon Ink and Chemicals, Inc.) | 40 |
| Curing accelerator 1-cyanoethyl-2-phenylimidazole (2PZ-CN, a trade name, mfd. by Shikoku Chemicals Corp.) | 0.3 |

Step 3

The resin-attaching copper foil prepared in step 2 was piled on the inner circuit substrate prepared in Step 1 so as to contact the resin side with the inner circuit side, followed by lamination at 90° C. under a linear pressure of 20 kgf/cm.

The copper foil in which via holes are to be formed was removed by etching so as to make circular holes having a diameter of 0.2 mm.

Step 4

Via holes were formed by chemical etching using the following etching solution under the following conditions:

| (Composition of chemical etching solution) | |
| --- | --- |
| Water | 800 ml/l |
| Diethylene glycol monobutyl ether | 200 ml/l |
| Borax | 10 g/l |
| Monoethanolamine | 5 g/l |
| (Conditions for chemical etching) | |
| Temperature of solution | 45° C. |
| Spray pressure | 0.7 kg/cm |
| Time | 5 min. |

Step 5

The via hole formed laminate was dried at 170° C. for 30 minutes to cure the resin composition.

Step 6

In a plating solution (L-59 Plating solution, a trade name, mfd. by Hitachi Chemical Co., Ltd.), the laminate obtained in Step 5 was immersed at 70° C. for 6 minutes, followed by copper sulfate electroplating to form a conductor layer with 20 μm thick on outermost copper foil, inner walls of via holes and conductors of the inner circuit exposed by chemical etching.

Step 7

An etching resist was formed on the portions on which circuits are to be formed and the via holes, and the copper not covered with the etching resist was removed by etching to form the outermost circuit.

EXAMPLE 2

The process of Example 1 was repeated except for using the following resin composition in Step 2:

|  | parts |
| --- | --- |
| Epoxy resin (Epikote 828, a trade name, mfd. by Yuka Shell Co., Ltd., Mn = 400) | 60 |
| Acrylonitrile-butadiene rubber containing 4% by mole of methacrylic acid (PNR-1H, a trade name, mfd. by Japan Synthetic Rubber Co., Ltd.) | 40 |
| Novolac phenol resin (Phenolite 2882, a trade name, mfd. by Dainippon Ink and Chemicals, Inc.) | 40 |
| Curing accelerator (2PZ-CN, a trade name, mfd. by Shikoku Chemical Corp.) | 0.3 |
| Ion adsorbent (IXE 600, a trade name, mfd. by Toagosei Chemical Industry Co., Ltd.) | 5 |

EXAMPLE 3

The process of Example 1 was repeated except for using the following resin composition in Step 2.

|  | Parts |
| --- | --- |
| Epoxy resin (Epikote 828, a trade name, mfd. by Yuka Shell Co., Ltd., Mn = 400) | 60 |
| Acrylonitrile-butadiene rubber containing 4% by mole of methacrylic acid (PNR-1H, a trade name, mfd. by Japan Synthetic Rubber Co., Ltd.) | 40 |
| Novolac phenol resin (Phenolite 2882, a trade name, mfd. by Dainippon Ink and Chemicals, Inc.) | 40 |
| Curing accelerator (2PZ-CN, a trade name, mfg. by Shikoku Chemicals Corp.) | 0.3 |
| Ion adsorbent (IXE 600, a trade name, mfd. by toagosei Chemical Industry Co., Ltd.) | 5 |
| Alumina filler (AS-50, a trade name, mfd. by Showa Denko K.K.) | 160 |
| Silane coupling agent (A-187, a trade name, mfd. by Nippon Unicar Co., Ltd.) | 3 |

EXAMPLE 4

The process of Example 3 was repeated except for using as the epoxy resin Epikote 834 (a trade name, mfd. by Yuka Shell Co., Ltd., Mn=650).

EXAMPLE 5

The process of Example 3 was repeated except for using the following chemical etching solution:

| (Composition of chemical etching solution) | |
| --- | --- |
| Water | 780 ml/l |
| Diethylene glycol monobutyl ether | 220 ml/l |
| Borax | 20 g/l |

EXAMPLE 6

The process of Example 3 was repeated except for using the following chemical etching solution:

| (Composition of chemical etching solution) | |
|---|---|
| Water | 780 ml/l |
| Dipropylene glycol monobutyl ether | 220 ml/l |
| Borax | 20 g/l |
| Monoethanolamine | 5 g/l |

EXAMPLE 7

The process of Example 3 was repeated except for using the following chemical etching solution:

| (Composition of chemical etching solution) | |
|---|---|
| Water | 800 ml/l |
| Diethylene glycol monoethyl ether | 200 ml/l |
| Borax | 10 g/l |
| Monoethanolamine | 5 g/l |

EXAMPLE 8

The process of Example 3 was repeated except for using the following chemical etching solution:

| (Composition of chemical etching solution) | |
|---|---|
| Water | 800 ml/l |
| Diethylene glycol monobutyl ethyl | 200 ml/l |
| Borax | 10 g/l |
| Triethanolamine | 5 g/l |

EXAMPLE 9

The process of Example 3 was repeated except for using the following chemical etching solution:

| (Composition of chemical etching solution) | |
|---|---|
| Water | 800 ml/l |
| Diethylene glycol monobutyl ether | 200 ml/l |
| Borax | 10 g/l |
| Diethanolamine | 5 g/l |

EXAMPLE 10

The process of Example 3 was repeated except for not using the silane coupling agent in the resin composition.

EXAMPLE 11

The process of Example 3 was repeated except for not using the ion adsorbent in the resin composition.

Comparative Example 1

The process of Example 3 was repeated except for using as the epoxy resin Epikote 1004 (a trade name, mfd. by Yuka Shell Co., Ltd., Mn=1750).

The resulting multilayer printed circuit boards were subjected to tests of thermal resistance, voltage-withstanding (dielectric strength) test, voltage-withstand test after pressure cooker test (PCT) test, flexibility of coating, easiness of chemical etching, as mentioned below.

(Thermal resistance)

The resin attached copper foil obtained in Step 2 in Example 1 was adhered to an aluminum plate of 30 mm square and 2 mm thick with heating at 170° C. under a pressure of 1.96 MPa for 30 minutes. Then, the periphery of the copper foil was removed by etching so as to retain the copper foil of 10 mm long and 14 mm wide.

On the resulting test piece of copper foil, a transistor (2SC2233) was fixed using solder. The test piece was placed on a heat dissipation block so as to contact the aluminum phase side with the heat dissipation block. A current was passed through the transistor. After measuring the temperature (T1) of the transistor and the temperature (T2) of the heat dissipation block, the thermal resistance (X) was calculated using the following Equation 1 and the temperatures and the power (W):

$$X=(T1-T2)/W \qquad \text{Equation 1}$$

(Voltage-withstand test)

The resin attached copper foil obtained in Step 2 in Example 1 was adhered to an aluminum plate of 30 mm square and 2 mm thick with heating at 170° C. under a pressure of 1.96 MPa for 30 minutes. Then, the periphery of the copper foil was removed by etching so as to retain the a circular copper foil of 20 mm in diameter.

An alternating voltage was applied between the copper foil and the aluminum plate, and the voltage at which short-circuited was measured.

(Voltage-withstand test after PCT)

After allowed to stand in a chamber at a temperature of 121° C., humidity of 100% and atmospheric pressure of 2026 hPa for 96 hours, a test piece was taken out and subjected to the voltage-withstand test.

(Flexibility of coated film)

The resin attached copper foil obtained in Step 2 in Example 1 was winded around a cylinder of 10 mm in diameter at 25° C. and the generation of cracks was observed by the naked eye.

(Easiness of chemical etching)

After chemical etching in Step 4 in Example 1, the state of via holes was evaluated, wherein the diameter of via hole of 0.1 mm or more was evaluated as "good", and the diameter of via hole of less than 0.1 mm was evaluated as "no good".

The results are shown in Table 1.

TABLE 1

| Example No. | Thermal resistance (°C./W) | Voltage-withstand test (kv) | Voltage-withstand test after PCT (kv) | Flexibility | Easiness of chemical etching |
|---|---|---|---|---|---|
| Example 1 | 2.4 | 7.5 | 4.2 | Good | Good |
| Example 2 | 0.8 | 7.3 | 5.0 | Good | Good |
| Example 3 | 0.8 | 7.2 | 6.1 | Good | Good |
| Example 4 | 0.8 | 7.2 | 6.0 | Good | Good |
| Example 5 | 0.8 | 7.3 | 5.9 | Good | Good |
| Example 6 | 0.8 | 7.2 | 6.1 | Good | Good |
| Example 7 | 0.8 | 7.2 | 6.0 | Good | Good |
| Example 8 | 0.8 | 7.2 | 6.0 | Good | Good |
| Example 9 | 0.8 | 7.3 | 6.1 | Good | Good |
| Example 10 | 0.8 | 7.2 | 2.0 | Good | Good |
| Example 11 | 0.8 | 7.2 | 3.1 | Good | Good |
| Comparative Example 1 | 0.8 | 7.2 | 6.0 | No good | No good |

EXAMPLE 12

Step 1

On a circuit substrate having a copper foil thickness of 70 μm, a thermosetting solder resist (CCR-506 GTH, a trade name, mfd. by Asahi Chemical Research Laboratory Co., Ltd.) as a filling material was printed so as to make the film thickness after drying and curing 70 μm and dried with curing at 160° C. for 10 minutes.

Step 2

The solder resist (filling material) on the circuits was removed by abrasion.

Step 3

The same resin composition as used in Example 1 was coated on a copper foil of 50 μm thick to form an insulating adhesion layer. The resulting copper foil was piled on the circuit substrate obtained in Step 2 so as to contact the insulating adhesive layer with the solder resist abraded circuits and pressed with heating to form an integrated structure.

Copper foil in which interlaminer connection is to be conducted was removed by etching, and the exposed insulating adhesive was removed by chemical etching in the same manner as described in Example 1.

Step 4

Interlaminer connection was conducted by plating.

Step 5

Unnecessary copper foil was removed to form a circuit pattern.

EXAMPLE 13

The process of Example 12 was repeated except for coating the solder resist by a screen printing method.

EXAMPLE 14

Step 1

On an aluminum based circuit substrate having a copper foil of 70 μm thick thereon, a thermosetting solder resist (CCR-506 GTH, a trade name, mfd. by Asahi Chemical Research Laboratory Co., Ltd.) as a filling material was printed so as to make the film thickness after drying and curing 70 μm, and dried with curing at 160° C. for 10 minutes.

Step 2

The solder resist on the circuits was removed by abrasion.

Step 3

The same resin composition as used in Example 1 was coated on a copper foil of 50 μm thick to form an insulating adhesion layer. The resulting copper foil was piled on the circuit substrate so as to contact the insulating adhesive with the solder resist abraded circuits and pressed with heating to form an integrated structure.

Copper foil in which interlaminer connection is to be conducted was removed by etching, and the exposed insulating adhesive was removed by chemical etching in the same manner as described in Example 1.

Step 4

Interlaminer connection was conducted by plating.

Step 5

Unnecessary copper foil was removed to form a circuit pattern.

Comparative Example 2

The process of Example 12 was repeated except for not filling hollow portions with the filling material.

Comparative Example 3

The process of Example 13 was repeated except for not filling hollow portions with the filling material.

The resulting multilayer printed circuit boards were subjected to the following tests.

(Circuit filling properties)

The portion between the underlayer copper foil (circuit) and the insulating adhesive layer was observed using a microscope. When a space having a diameter of more than 10 μm was not found, it was evaluated as "good". On the other hand, when a space having a diameter of more than 10 μm was found, it was evaluated as "no good".

(Dielectric strength)

Alternating voltage was applied to upper and lower circuits at 25° C. from 0 V at a rate of 100 V/sec. When a current of 1 mA was passed, it was regarded as the voltage at dielectric breakdown.

(Solder resistance)

A multilayer printed circuit board was immersed in a solder bath at 260° C. for 180 seconds. When no blister, nor delamination was observed, it was evaluated as "good".

The results are shown in Table 2.

TABLE 2

| Example No. | Circuit filling properties | Dielectric strength (kv) | Distance between upper and lower circuits (μm) | Solder heat resistance |
| --- | --- | --- | --- | --- |
| Example 12 | Good | 6.3 | 50 | Good |
| Example 13 | Good | 5.9 | 50 | Good |
| Example 14 | Good | 6.3 | 50 | Good |
| Comparative Example 2 | No good | 2.5 | 34 | No good |
| Comparative Example 3 | No good | 3.0 | 50 | No good |

As shown above, the multilayer printed circuit boards produced by the process (A) of the present invention (Examples 12 to 14) are excellent in surface flatness compared with those of Comparative Examples 2 and 3.

EXAMPLE 15

Step 1

On a circuit substrate having a copper foil (circuit) of 70 μm thick, a thermosetting solder resist (CCR-506GTH, a trade name, mfd. by Asahi Chemical Research Laboratory Co., Ltd.) as a filling material was printed so as to make the film thickness 70 μm after dried, and dried with curing at 110° C. for 10 minutes (at B-stage).

Step 2

The same resin composition as used in Example 1 was coated on a copper foil of 50 μm thick to form an insulating adhesive layer. The resulting copper foil was piled on the circuit substrate so as to contact the insulating adhesive layer with the circuits and pressed with heating to form an integrated structure.

Copper foil in which interlaminer connection is to be conducted was removed by etching, and the exposed insulating adhesive was removed by chemical etching in the same manner as described in Example 1.

Step 3

Interlaminer connection was conducted by plating.

Step 4

Unnecessary copper foil was removed to form a circuit pattern.

EXAMPLE 16

Step 1

On a circuit substrate having a copper foil (circuit) of 70 μm thick, a thermosetting solder resist (CCR-506GTH, a trade name, mfd. by Asahi Chemical Research Laboratory Co., Ltd.) as a filling material was screen printed so as to make the film thickness 70 μm after dried, and dried with curing at 110° C. for 10 minutes (B-stage).

Step 2

The same resin composition as used in Example 3 was coated on a copper foil of 50 μm thick to form an insulating adhesive layer. The resulting copper foil was piled on the circuit substrate so as to contact the insulating adhesive layer with the circuits and pressed with heating to form an integrated structure.

Copper foil in which interlaminer connection is to be conducted was removed by etching, and the exposed insulating adhesive was removed by chemical etching in the same manner as described in Example 3.

Step 3

Interlaminer connection was conducted by plating.

Step 4

Unnecessary copper foil was removed to form a circuit pattern.

Comparative Example 4

The process of Example 15 was repeated except for not using the filing material for filling hollow portions between circuits.

Comparative Example 5

The process of Example 15 was repeated except for drying and curing the filling material at 160° C. for 30 minutes (C-stage) so as to cure to non-flowable state.

The resulting multilayer printed circuits boards were tested.

The results are shown in Table 3.

TABLE 3

| Example No. | Circuit filling properties | Dielectric strength (kv) | Solder heat resistance |
|---|---|---|---|
| Example 15 | Good | 6.3 | Good |
| Example 16 | Good | 5.9 | Good |
| Comparative Example 4 | No good | 2.5 | No good |
| Comparative Example 5 | No good | 2.5 | No good |

As shown above, according to the process (B) of the present invention, Examples 15 and 16 are good in the circuit filling properties and solder heat resistance, i.e. excellent in interlaminer connection reliability.

EXAMPLE 17

Step 1

A varnish having the composition A shown in Table 4 was prepared. The varnish was coated on a copper foil of 35 μm thick so as to make the film thickness after dried 70 μm, and dried at 110° C. for 10 minutes (B-stage) to give a sheet-like insulating adhesive.

Step 2

The sheet-like insulating adhesive was drilled at predetermined positions using a numerical controlled drilling machine to form holes having a diameter of 0.2 mm. Then, the sheet-like insulating adhesive was adhered to a circuit substrate having a circuit pattern of 35 μm thick with heating under pressure using a press.

Step 3

The flowable component oozed into the holes was removed by chemical etching using the chemical etching solution of Example 9.

Step 4

Heat treatment was carried out at 170° C. for 30 minutes.

Step 5

The holes were copper plated, and subjected to interlaminer connection to give a multilayer printed circuit board.

EXAMPLE 18

Step 1

A varnish having the composition B shown in Table 4 was prepared. On a copper foil of 35 μm thick, the varnish was coated as a first layer so as to make the film thickness after dried 40 μm, followed by drying with curing at 170° C. for 10 minutes. Then, a varnish having the composition A shown in Table 4 was coated as a second layer so as to make the total (first and second) film thickness 80 μm after dried, and dried at 110° C. for 10 minutes (B-stage) to give a sheet-like insulating adhesive.

Step 2

The sheet-like insulating adhesive was drilled at predetermined positions using a numerical controlled drilling machine to form holes having a diameter of 0.2 mm. Then, the sheet-like insulating adhesive was adhered to a metal based circuit substrate having a circuit pattern of 70 μm thick with heating under pressure using a press.

Step 3

The flowable component oozed into the holes was removed by chemical etching using the chemical etching solution of Example 9.

Step 4

Heat treatment was conducted at 170° C. for 30 minutes.

Step 5

The holes were copper plated, and subjected to interlaminer connection to give a multilayer printed circuit board.

EXAMPLE 19

Step 1

A varnish having the composition C shown in Table 4 was prepared. On a copper foil of 35 μm thick, the varnish was coated as a first layer so as to make the film thickness after dried 40 μm, followed by drying and curing at 170° C. for 10 minutes. Then, a varnish having the composition B shown in Table 4 was coated as a second layer so as to make the total (first and second) film thickness 80 μm after dried, and dried at 110° C. for 10 minutes (B-stage) to give a sheet-like insulating adhesive.

Step 2

The sheet-like insulating adhesive was drilled at predetermined positions using a numerical controlled drilling machine to form holes having a diameter of 0.2 mm. Then, the sheet-like insulating adhesive was adhered to a circuit substrate having a circuit pattern of 70 μm thick with heating under pressure using a press.

Step 3

The flowable component oozed into the holes was removed by chemical etching using the chemical etching solution of Example 9.

Step 4

Heat treatment was carried out at 170° C. for 30 minutes.

Step 5

The holes were copper plated, and subjected to interlaminer connection to give a multilayer printed circuit board.

EXAMPLE 20

Step 1

A varnish having the composition C shown in Table 4 was prepared. The varnish was coated as a first layer on a copper foil of 35 μm thick so as to make the film thickness after dried 40 μm, followed by drying with curing at 170° C. for 10 minutes. Then, a varnish having the composition A shown in Table 4 was coated as a second layer so as to make the total (first and second) film thickness 80 μm after dried, and dried at 110° C. for 10 minutes (B-stage) to give a sheet-like insulating adhesive.

Step 2

The sheet-like insulating adhesive was drilled at predetermined positions using a numerical controlled drilling machine to form holes having a diameter of 0.2 mm. Then, the sheet-like insulating adhesive was adhered to a metal based circuit substrate having a circuit pattern of 70 μm thick with heating under pressure using a press.

Step 3

The flowable component oozed into the holes was removed by chemical etching using the chemical etching solution of Example 9.

Step 4

Heat treatment was conducted at 170° C. for 30 minutes.

Step 5

The holes were copper plated, and subjected to interlaminer connection to give a multilayer printed circuit board.

TABLE 4

| Component | Material | Composition (parts) | | |
| --- | --- | --- | --- | --- |
| | | A | B | C |
| Epoxy resin | Epikote 828 (Mn = 400) | 70 | 70 | 70 |
| Rubber component | PNR-1H | 30 | 30 | 30 |
| Curing agent | Phenol novolac | 35 | 35 | 35 |
| Curing accelerator | 2PZ-CN | 0.5 | 0.5 | 0.5 |
| Non-flowable component | Ultra-high molecular weight epoxy resin | 0 | 30 | 0 |
| | Alumina powder | 0 | 0 | 30 |

The multilayer printed circuit boards were subjected to the following tests.

(Interlaminer connection reliability)

Connection resistance values were measured at 100 interlaminer connection portions in a multilayer printed circuit board. The connection resistance of 1Ω or less at all the connection portions was evaluated as "good" and that of more than 1Ω was evaluated as "no good".

(Minimum connection hole diameter)

The minimum hole diameter was determined by measuring a diameter of underlayer copper foil exposed to surface, not covered with oozed insulating adhesive.

(Circuit filling properties)

See Example 14 and Table 2.

The results are shown in Table 5.

TABLE 5

| Example No. | Interlaminer connection reliability | Minimum connection hole diameter (μm) | Circuit filling properties |
| --- | --- | --- | --- |
| Example 17 | Good | 200 | Good |
| Example 18 | Good | 200 | Good |
| Example 19 | Good | 200 | Good |
| Example 20 | Good | 200 | Good |

As mentioned above, according to the process (C) of the present invention, the hole bottom connection area can be maintained and oozing of the resin and covering the processed circuits with the oozed resin in a cavity can be prevented.

EXAMPLE 21

Step 1

A varnish having the composition D shown in Table 6 was prepared. The varnish was coated on a polyethylene sheet of 35 μm thick so as to make the film thickness after dried 70 μm, dried at 80° C. for 10 minutes, and further dried at 100° C. for 5 minutes to give a sheet-like insulating adhesive after removal of polyethylene sheet.

Step 2

The sheet-like insulating adhesive was drilled at predetermined portions using an numerical controlled drilling machine to form holes having a diameter of 0.2 mm.

The sheet-like insulating adhesive and copper foil of 35 μm thick were piled on a circuit substrate having a circuit pattern of 35 μm thick and subjected to heating under pressure using a hot roll laminator.

Step 3

After forming holes having a diameter of 200 μm in the copper foil by etching, the insulating adhesive oozed in the holes was subjected chemical etching using the chemical etching solution of Example 9 to form via holes.

Step 4

After coating a silver paste on inner walls of the via holes, heat treatment at 170° C. for 30 minutes was conducted to give a multilayer printed circuit board.

EXAMPLE 22

Step 1

A varnish having the composition D shown in Table 6 was prepared. The varnish was coated as a first layer on a polyethylene sheet of 35 μm thick so as to make the film thickness after dried 70 μm, and dried at 80° C. for 10 minutes, followed by further drying at 100° C. for 5 minutes. Then, the same varnish as mentioned above was coated as a second layer on the first layer so as to make the total film thickness after dried 140 μm, and dried at 80° C. for 10 minutes, followed by further drying at 100° C. for 5 minutes to form a sheet-like insulating adhesive after removal of the polyethylene sheet.

Step 2

The sheet-like insulating adhesive was drilled at predetermined portions using an numerical controlled drilling machine to form holes having a diameter of 0.2 mm.

The copper foil obtained in Step 1 was piled on the insulating adhesive and a circuit substrate having a circuit pattern of 70 μm thick and subjected to heating under pressure using a hot roll laminator.

Step 3

After forming holes having a diameter of 200 μm in the copper foil by etching, the insulating adhesive oozed in the holes was subjected to chemical etching using the chemical etching solution of Example 9 to form via holes.

Step 4

After coating a silver paste on inner walls of the via holes, heat treatment at 170° C. for 30 minutes was conducted to give a multilayer printed circuit board.

EXAMPLE 23

The process of Example 21 was repeated except for using as the chemical etching solution a solution comprising dimethylformamide (DMF) and water.

EXAMPLE 24

The process of Example 21 was repeated except for using a varnish having the composition E shown in Table 6, and a metal based circuit substrate having a circuit pattern of 70 μm thick.

TABLE 6

| Component | Material | Composition D | Composition E |
|---|---|---|---|
| Epoxy resin | Epikote 828 (Mn = 400) | 70 | 70 |
| Rubber component | PNR-1H | 30 | 30 |
| Curing agent | Phenol novolac | 35 | 35 |
| Curing accelerator | 2PZ-CN | 0.5 | 0.5 |
| Filler | Alumina powder | 0 | 150 |

The multilayer printed circuit boards were subjected to the tests of the circuit filling properties, interlaminer connection reliability, minimum connection hole diameter and thermal resistance mentioned above.

The results are shown in Table 7.

TABLE 7

| Example No. | Circuit filling properties | Interlaminer connection reliability | Minimum connection hole diameter (μm) | Thermal resistance (°C./W) |
|---|---|---|---|---|
| Example 21 | Good | Good | 200 | >10 |
| Example 22 | Good | Good | 200 | >10 |
| Example 23 | Good | Good | 200 | >10 |
| Example 24 | Good | Good | 200 | 2 |

As shown above, according to the process (D) of the present invention, since via holes for interlaminer connection can be formed by using the semi-aqueous chemical etching solution, resistance to alkali, surface flatness and connection reliability in the case of small via hole diameters can be improved. Further, electroless plating becomes possible for interlaminer connection.

Thus, multilayer printed circuit boards having blind holes can be produced by low cost with high reliability.

What is claimed is:

1. A process for producing a multilayer printed circuit board, which comprises the steps of:

(a) forming a resin layer for filling hollow portions between circuit conductors on the whole surface of an inner circuit substrate, followed by abrasion of the resin layer so as to expose the circuit conductors, (b) piling a copper foil having a layer of insulating adhesive on one side so as to contact the insulating adhesive with the resin layer and the exposed circuit conductors, followed by lamination to form an integrated structure with heating under pressure, (c) removing portions necessary for connection with the copper foil by etching, and removing the insulating adhesive exposed to holes by chemical etching, (d) connecting the copper foil with circuits exposed to the holes and forming a surface circuit by processing an outer layer of the copper foil, and (e) repeating the steps (a) to (d) to obtain a multilayer printed circuit board, wherein the insulating adhesive is a composition comprising (a) from 30 to 100 parts by weight of an epoxy resin having a number average molecular weight of 1200 or less, (b) from 30 to 70 parts by weight of a carboxylic acid-containing acrylonitrile-butadiene rubber or a carboxylic acid-containing acrylic rubber other than the carboxylic acid-containing acrylonitrile-butadiene rubber, (c) a curing agent for the epoxy resin, and (d) a curing accelerator.

2. A process according to claim 1, wherein at least one of the resin layer and the insulating adhesive layer contains an inorganic filler which imparts heat dissipation properties.

3. A process according to claim 1, wherein the chemical etching is carried out using a chemical etching solution comprising water and an organic solvent having a vapor pressure of 133 Pa or less at 25° C.

* * * * *